United States Patent [19]

Itoh et al.

[11] Patent Number: 5,229,663
[45] Date of Patent: Jul. 20, 1993

[54] EMITTER-COUPLED LOGIC CIRCUIT DEVICE HAVING A CURRENT SWITCH AND AN EMITTER FOLLOWER WHICH RESPECTIVELY HAVE COMMON EMITTER CURRENT GAINS SELECTED TO MINIMIZE DELAY TIME

[75] Inventors: Nobuyuki Itoh; Mikiko Kondoh, both of Tokyo, Japan

[73] Assignee: Kabushiki Kaisha Toshiba, Kawasaki, Japan

[21] Appl. No.: 748,075

[22] Filed: Aug. 21, 1991

[30] Foreign Application Priority Data

Sep. 28, 1990 [JP] Japan ................... 2-261699

[51] Int. Cl.$^5$ ........................... H03K 19/086
[52] U.S. Cl. ........................ 307/455; 307/443
[58] Field of Search ....................... 307/443, 455

[56] References Cited

U.S. PATENT DOCUMENTS 4,255,672  3/1981  Ohno et al. .................. 307/455

OTHER PUBLICATIONS

Sedra, Adel S. and Kenneth C. Smith; "Microelectronic Circuits"; ©1987 by Holt, Rinehart and Winston, Inc., pp. 402, 403; 439; 632; 943-945 and 948.

"General Electric Transistor Manual"; Revised Printing 1969; pp. 153-155.

*Primary Examiner*—Edward P. Westin
*Assistant Examiner*—Benjamin D. Driscoll
*Attorney, Agent, or Firm*—Finnegan, Henderson, Farabow, Garrett & Dunner

[57] ABSTRACT

In an ECL circuit comprising current switch transistors and emitter follower transistor, the common emitter current gain of the current switch transistors and emitter follower transistor are set independently, and the common emitter current gain of the current switch transistors is selected so that the delay time is at its minimum. Further, the emitter areas of the current switch transistors and emitter follower transistor are set independently, and the emitter areas of the current switch transistors are set to be smaller than the emitter area of the emitter follower transistor.

5 Claims, 10 Drawing Sheets

EMITTER-COUPLED LOGIC CIRCUIT DEVICE HAVING A CURRENT SWITCH AND AN EMITTER FOLLOWER WHICH RESPECTIVELY HAVE COMMON EMITTER CURRENT GAINS SELECTED TO MINIMIZE DELAY TIME

BACKGROUND OF THE INVENTION

1. Field of the Invention

This invention relates to an emitter-coupled logic (ECL) circuit device provided in an integrated circuit semiconductor device. More specifically, the invention relates to the improvement of a high-speed ECL circuit which uses bipolar transistors.

2. Description of the Related Art

In recent years, high speed performances of an ECL circuit provided in an integrated circuit semiconductor device have been rapidly developed by scaling.

In order to increase the cut-off frequency of transistor and to efficiently decrease the delay time $t_{pd}$ of an ECL Circuit, it has been important subjects to improve self-alignment techniques enabling the forming of a shallow emitter/base region as well as optimization in transistor fabrication and ECL circuit design in accordance with the scaling.

When designing an ECL circuit, the common emitter current gain $h_{FE}$ is considered to be a very important parameter since it determines the operating point of the ECL circuit.

Two types of transistors are used for an ECL circuit, namely, transistors which constitute a current switch and a transistor which constitutes emitter follower. Research concerning how to use these two transistor types have been conducted from the view point of current distribution by considering total power dissipations (refer to, for example, The Transactions of The Institute of Electronics, Information and Communication Engineers '86/6 Vol. J69-C No. 6). However, as far as common emitter current gain and emitter area are concerned, usually a completely identical common emitter current gain and emitter area are used for these transistors. Especially, the common emitter current gain $h_{FE}$ is generally set to be 100 as its central value, although no clear reasons were provided to set the common emitter current gain $h_{FE}$ to this value.

In order to increase the operating speed of an ECL circuit, it is required to decrease the base transit time of the carrier, the parasitic capacitance and the parasitic resistance in the transistors constituting the ECL circuit.

It has been found that it is not always possible to minimize the delay time by setting the emitter areas of the current switch transistors and the emitter follower transistor to be identical, since the contributions of the emitter/base junction capacitance to the delay in the current switch stage and to the delay in the emitter follower stage are different.

Furthermore, it has been known from the studies using simulation that there exits a limit for the reduction of the delay time in conventional ECL circuits with $h_{FE}=100$ and with a constant emitter area when devices are further reduced in size.

As described above, in conventional ECL circuits the emitter area of the current switch transistors and the emitter follower transistor is set to be completely identical. However, using transistors with a completely identical emitter area is an obstruction to achieve the high speed operation of the ECL circuit since the contributions of the emitter/base junction capacitance to the delay time of current switch transistors and emitter follower transistor are different.

Also, in conventional ECL circuits the common emitter current gain of the current switch transistors and the emitter follower transistor is set to be completely identical. However, using transistors with a completely identical common emitter current gain is an obstruction to achieve the high-speed operation of the ECL circuit since the contributions of the emitter base junction capacitance to the delay time of current switch transistors and the emitter follower transistor are different.

SUMMARY OF THE INVENTION

The present invention is made in view of the above-described circumstances, and it is an object of the present invention to provide a high-speed ECL circuit.

According to a first aspect of the present invention, in an ECL circuit comprising current switch transistors and an emitter follower transistor, the common emitter current gain of the current switch transistors and that of the emitter follower transistor are determined independently, and the common emitter current gain of the current switch transistors is selected so as to minimize its delay time.

Preferably, the common emitter current gain of the emitter follower transistor is set to be larger than that of the current switch transistors.

With the above-described configuration, it is possible to obtain a very high-speed ECL circuit compared with conventional ECL circuits in which current switch transistors and emitter follower transistor have completely identical common emitter current gain.

According to a second aspect of the present invention, in an ECL circuit comprising current switch transistors and an emitter follower transistor, the emitter area of the current switch transistors and that of emitter follower transistor are determined independently and the emitter area of the current switch transistors is set to be smaller than that of the emitter follower transistor.

With the above-described configuration, it is possible to obtain very high-speed ECL circuits compared with conventional ECL circuits in which current switch transistors and emitter follower transistor have completely identical emitter area.

DESCRIPTION OF THE PREFERRED EMBODIMENT

In order to examine the change in the gate delay of a bipolar transistor with respect to its common emitter current gain $h_{FE}$ as a result of scaling, the inventors measured the relation between the gate delay and the common emitter current gain $h_{FE}$ of bipolar transistors for two different emitter areas. The result of the measurement is shown in FIG. 1 and FIG. 2.

Figure 1:
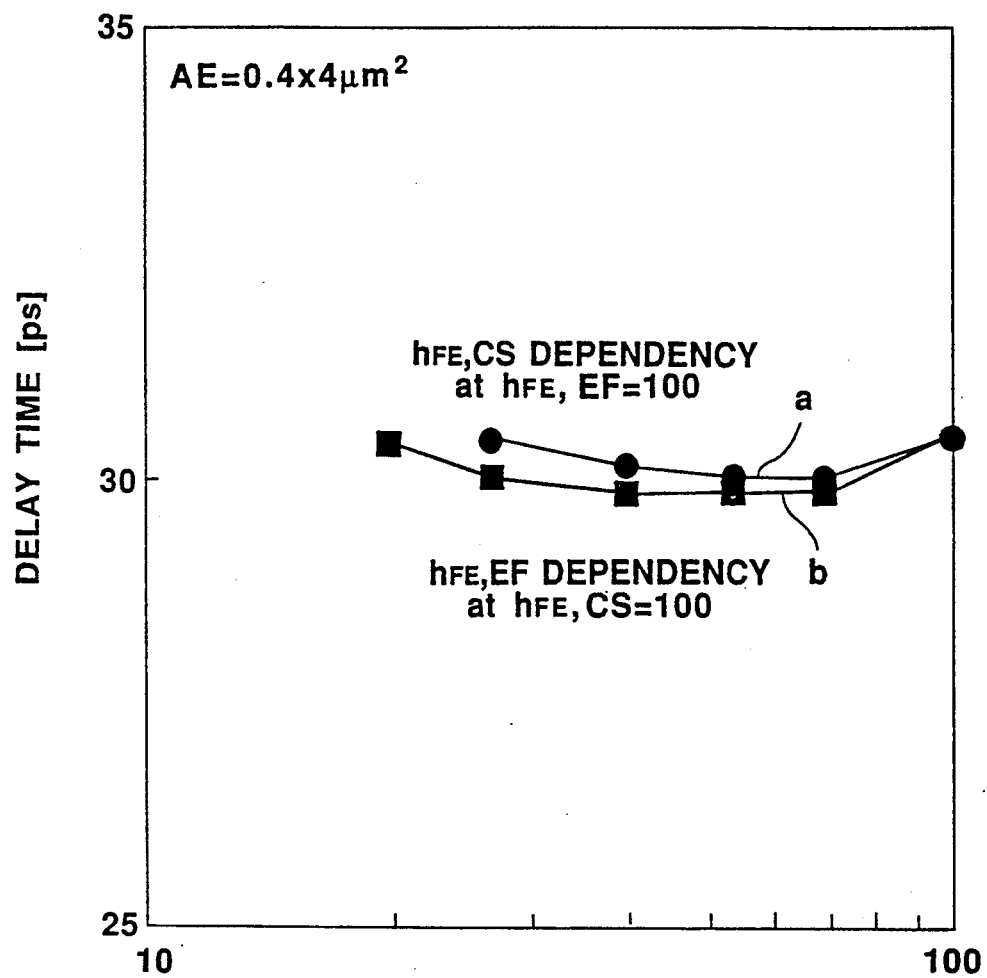
FIG. 1 is a graph illustrating the relation between the gate delay and common emitter current gain $h_{FE}$ of a bipolar transistor in a larger semiconductor device.

Referring to FIG. 1, curve a shows the change in the delay time $t_{pd}$ as the common emitter current gain $h_{FE}$ of the current switch CS changes while the common emitter current gain $h_{FE}$ of the emitter follower EF is kept constant at 100 and curve b shows the change in the delay time $t_{pd}$ as the common emitter current gain $h_{FE}$ of the emitter follower EF changes while the common emitter current gain $h_{FE}$ of the current switch CS is kept constant at 100 in an ECL circuit comprising bipolar transistors having emitter area of $0.4 \times 4$ $\mu m^2$ and base width of 80 nm.

Figure 2:
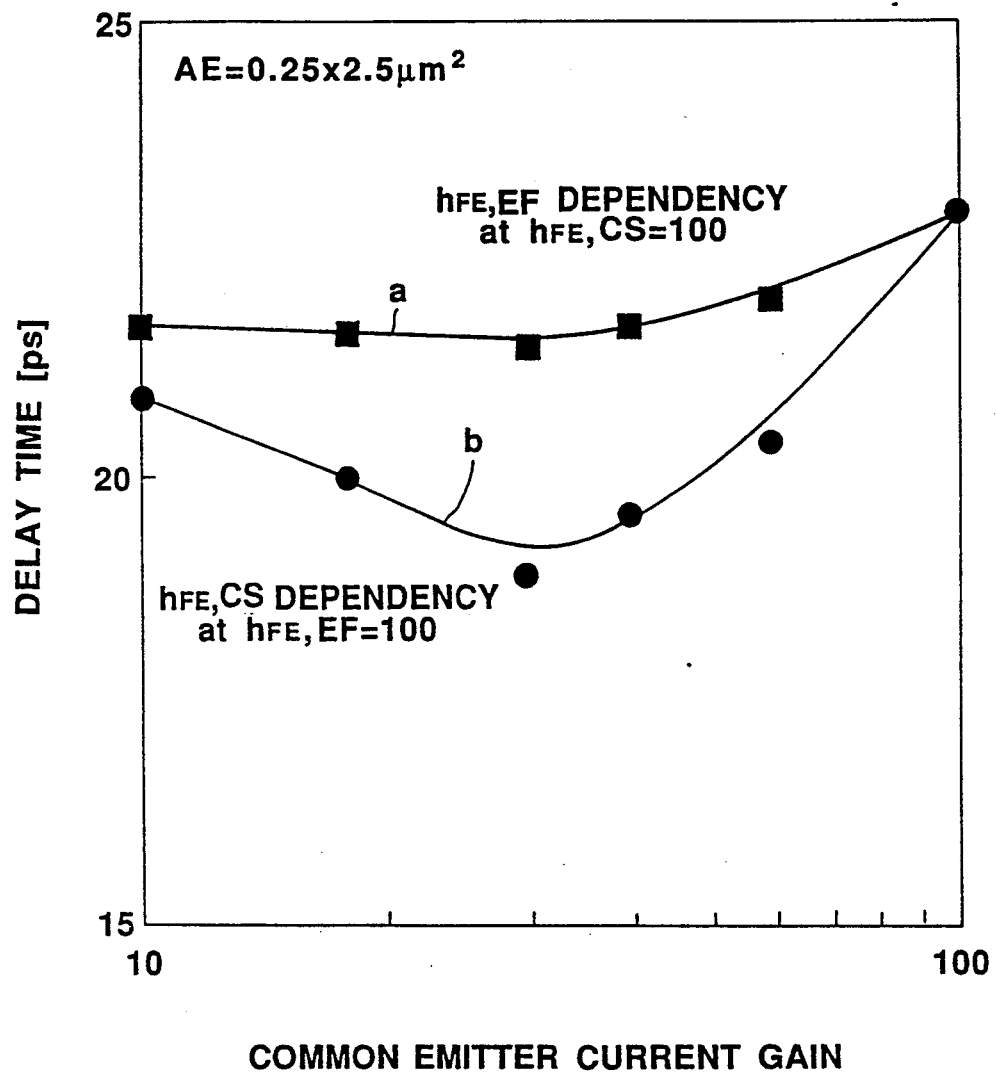
FIG. 2 is a graph illustrating the relation between the gate delay and $h_{FE}$ of a bipolar transistor in a smaller semiconductor device, FIGS. 3 (a), (b) and 4 (a), (b) illustrate the results of the measurement regarding the contribution of each parameter in the case of $h_{FE}=100$ and $h_{FE}=30$ respectively.

On the other hand, in FIG. 2, curve a shows the change in the delay time $t_{pd}$ as the common emitter current gain $h_{FE}$ of the current switch CS changes while the common emitter current gain $h_{FE}$ of the emitter follower EF is kept constant at 100 and curve b shows the change in the delay time $t_{pd}$ as the common emitter current gain $h_{FE}$ of the emitter follower EF changes while the common emitter current gain $h_{FE}$ of the current switch CS is kept constant at 100 in an ECL circuit comprising bipolar transistors having emitter area of $0.25 \times 2.5$ $\mu m^2$ and base width of 50 nm.

The minimum value of the delay time $t_{pd}$ is determined by the trade-off between the emitter/base junction capacitance $C_{je}$ and the base resistance RB. However, from FIGS. 1 and 2, it is apparent that, as scaling progresses, the delay time $t_{pd}$ depends largely on the common emitter current gain $h_{FE}$ of the current switch CS.

Therefore, in one aspect of the present invention, the direct current amplification factors of the current switch transistors and the emitter follower transistor are determined independently, and the common emitter current gain $h_{FE}$ of the current switch transistors is selected so as to minimize the delay time, thereby to achieve the realization of a high-speed ECL circuit.

When scaling of transistors is performed and the base width decreases, the impurity density in the base must be increased in order to maintain a low base resistance and to maintain collector-emitter breakdown voltage $BV_{CEO}$. It is known that the mobility of the electrons in the base decreases when the base density increases. On the other hand, the impurity density in the emitter cannot be increased any further due to the solid solubility limit. When scaling is performed under the condition that the internal base resistance is constant, it is understood from the following formula that the common emitter current gain $h_{FE}$ is decreased.

$$h_{FE} = \frac{\int N_E(x)dx}{\int N_B(x)dx} \times \frac{D_{nB}}{D_{pE}}$$

where $N_E(x)$, $N_B(x)$, $D_{nB}$ and $D_{pE}$ are impurity density in the emitter, impurity density in the base, electron diffusion coefficient in the base and hole diffusion coefficient in the emitter respectively.

Accordingly, when the emitter area is sufficiently large, the emitter/base junction capacitance $C_{je}$ is sufficiently large and the contribution to the delay time tpd due to a decrease in the base resistance $R_B$ is not too large. However, when the emitter area decreases, it appears that the contribution of $h_{FE}$ to the delay time $t_{Pd}$ increases.

Figure 3A:
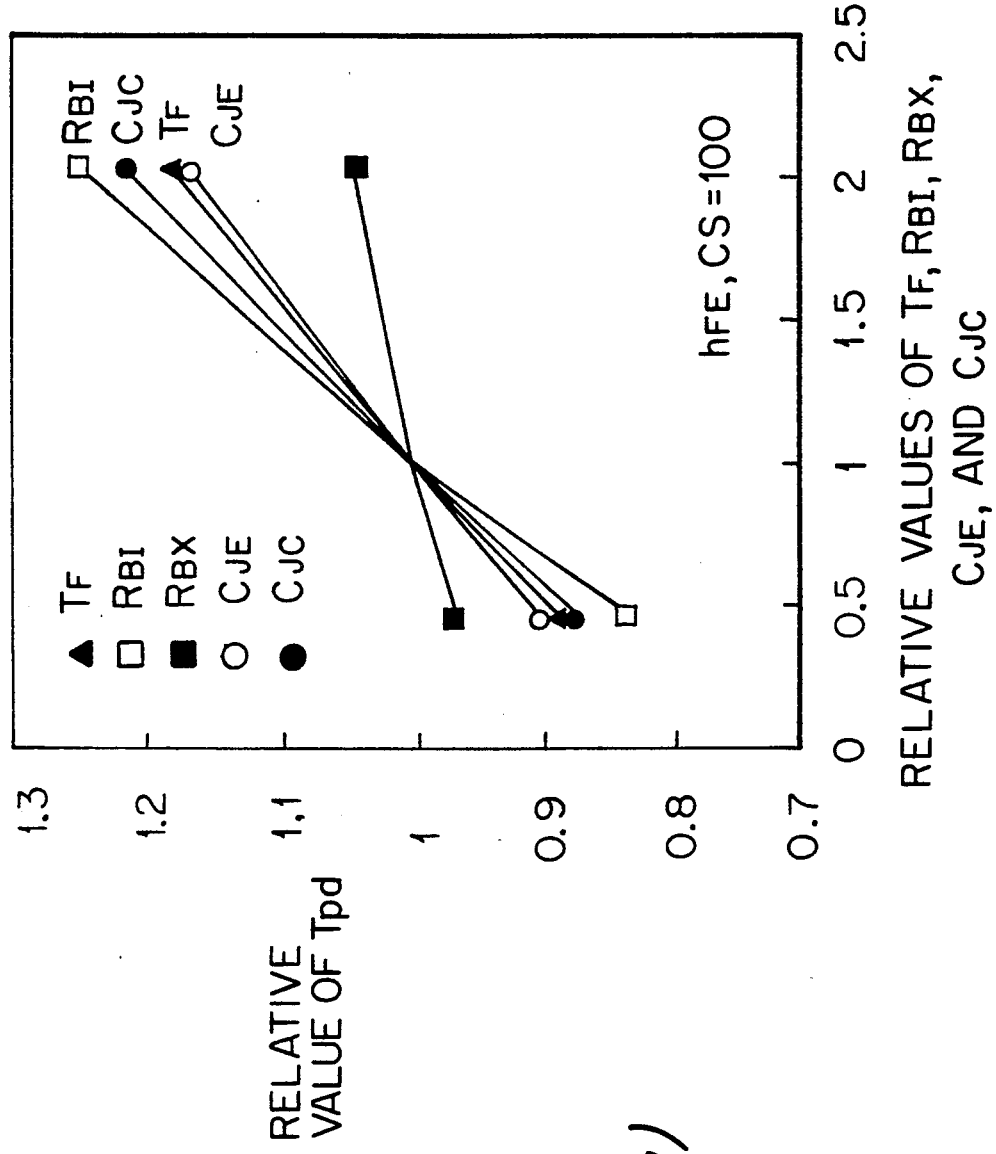
Figure 3B:
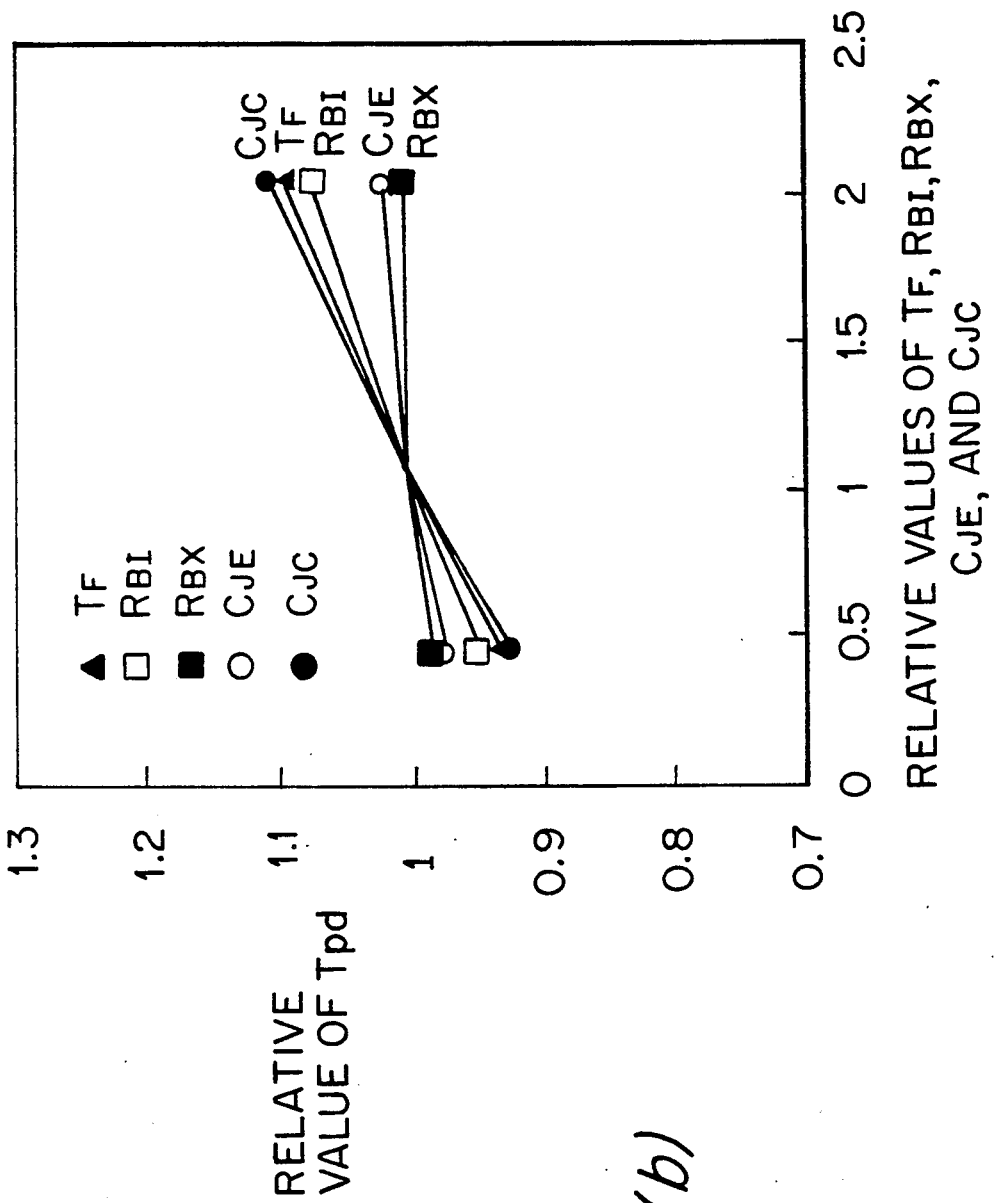
Figure 4A:
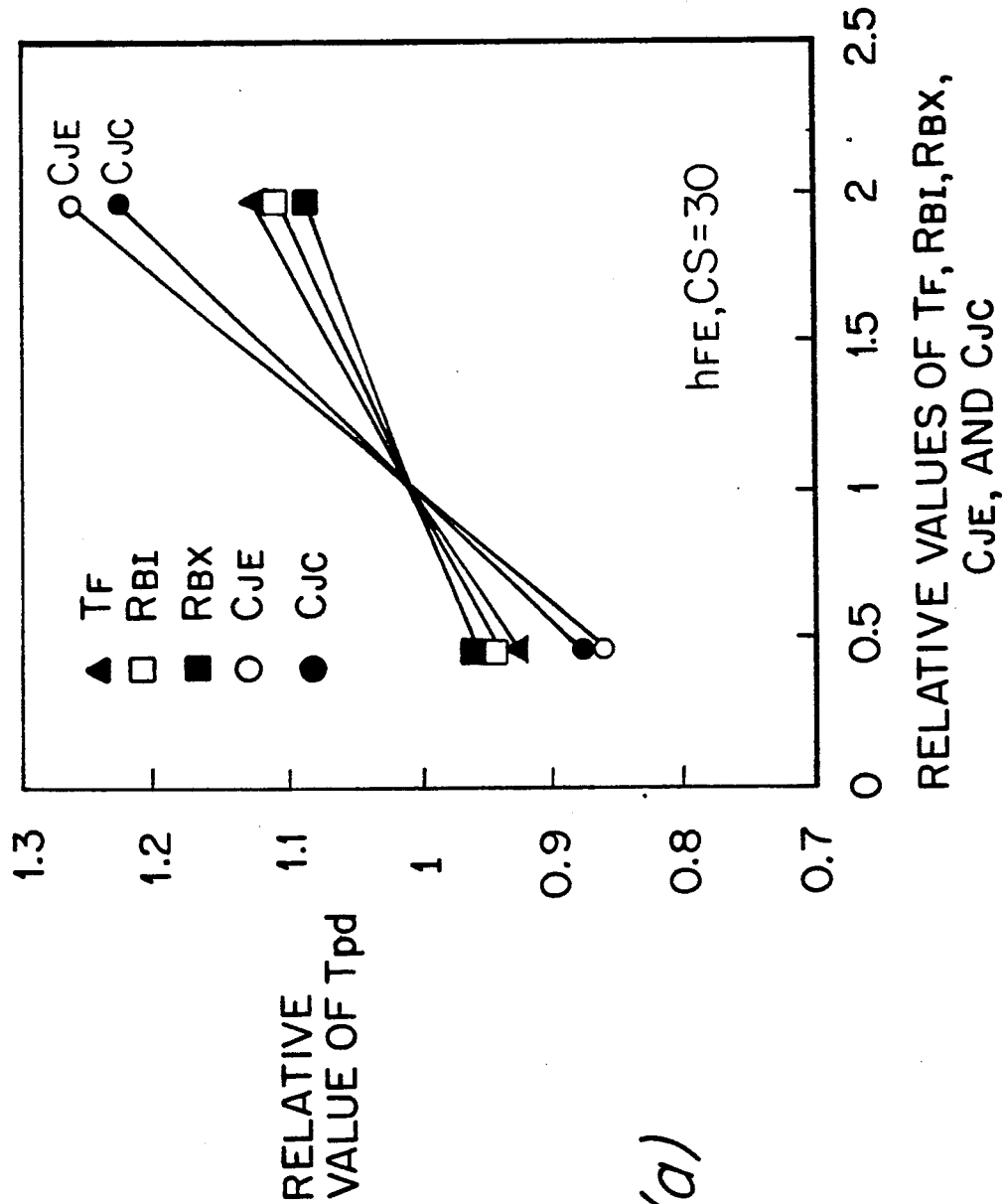
Figure 4B:
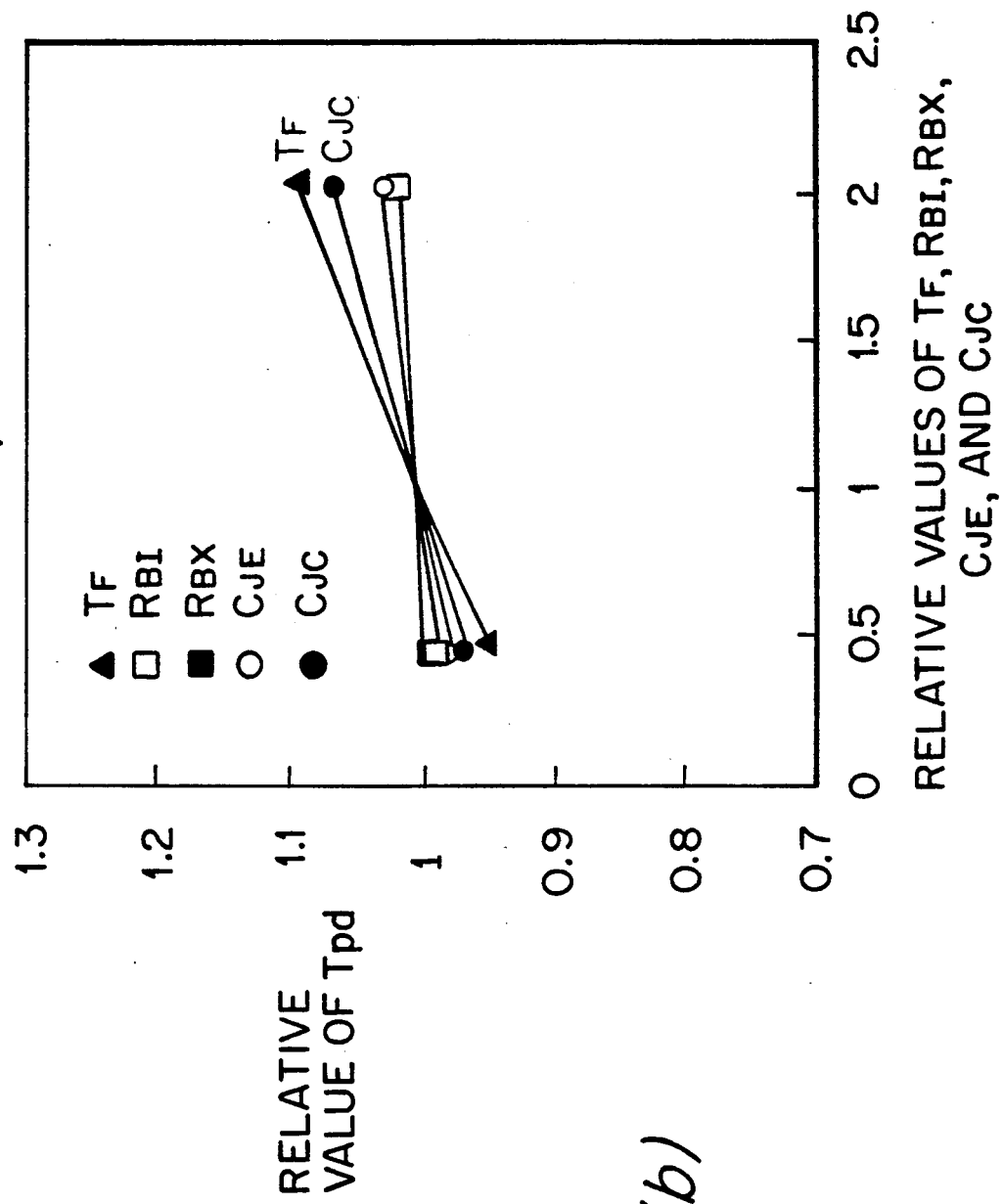

FIG. 3(a), FIG. 3(b), FIG. 4(a) and FIG. 4(b) show the result of the measurement regarding the contribution of each parameter in cases of $h_{FE}=100$ and $h_{FE}=30$, respectively. More particularly, FIG. 3(a) shows a case in which the common emitter current gain $h_{FE}$ of the current switch transistors is 100, FIG. 3(b) shows a case in which the common emitter current gain $h_{FE}$ of the emitter follower transistor is 100, FIG. 4(a) shows a case in which the common emitter current gain $h_{FE}$ of the current switch transistors is 30 and FIG. 4(b) shows a case in which the common emitter current gain $h_{FE}$ of the emitter follower transistor is 30.

As a result, it is understood that the influence of the base resistance $R_B$ and the collector/base junction capacitance $C_{jc}$ is great in either case in which the common emitter current gain $h_{FE}$ of the current switch transistors is 100 or that of the emitter follower transistor is 100, and that the influence of the emitter/base junction capacitance $C_{je}$ on the delay time $t_{pd}$ is dominant in case that the common emitter current gain $h_{FE}$ of the current switch transistors is 30. In other words, the influence of the base resistance $R_B$ is great when the common emitter current gain $h_{FE}$ of the current switch transistors is large, and the influence of the emitter/base junction capacitance $C_{je}$ is great when the common emitter current gain $h_{FE}$ is small. From this result it is apparent that the contribution of $h_{FE}$ to the delay time $t_{Pd}$ is large.

Thus, by selecting the common emitter current gain $h_{FE}$ of the current switch transistors such as to minimize the delay time, it is possible to realize a high-speed ECL gate. As scaling progresses, the value of the common emitter current gain $h_{FE}$ for which the delay time is at its minimum becomes small.

Figure 5:
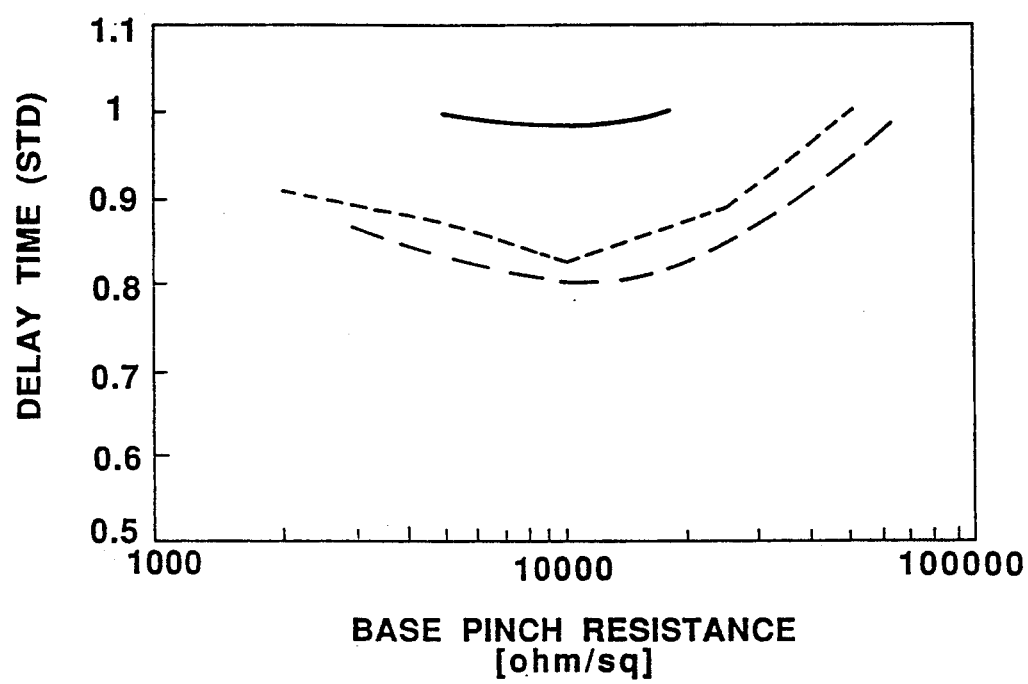
FIG. 5 illustrates the relation between the pinch resistance and delay time $t_{pd}$.

FIG. 5 illustrates the relation between the pinch resistance (internal base sheet resistance) and delay time $t_{pd}$. However, even when scaling is performed, the minimum point of the delay time $t_{pd}$ is constant at 10 kΩ/sq. This relation is established when emitter width $W_E$=emitter length $L_E/10$. The value is supposed to vary when the ratio of emitter width $W_E$ to emitter length $L_E$ varies, and to be a constant value.

However, in case of reducing $h_{FE}$ in emitter follower transistors, logic swing is reduced by the base current increasing and/or the collector current decreasing. Furthermore, the collector current of current switch transistors is reduced the same amount the base current of the emitter follower transistors increases, which also leads to a deterioration of the delay time $t_{pd}$.

Moreover, it is also apparent from FIG. 1 and FIG. 2 that reducing $h_{FE}$ in emitter follower transistors has little influence on the delay time $t_{pd}$. Therefore, it is recommended to keep $h_{FE}$ of emitter follower transistors at a value near 100.

Figure 7:
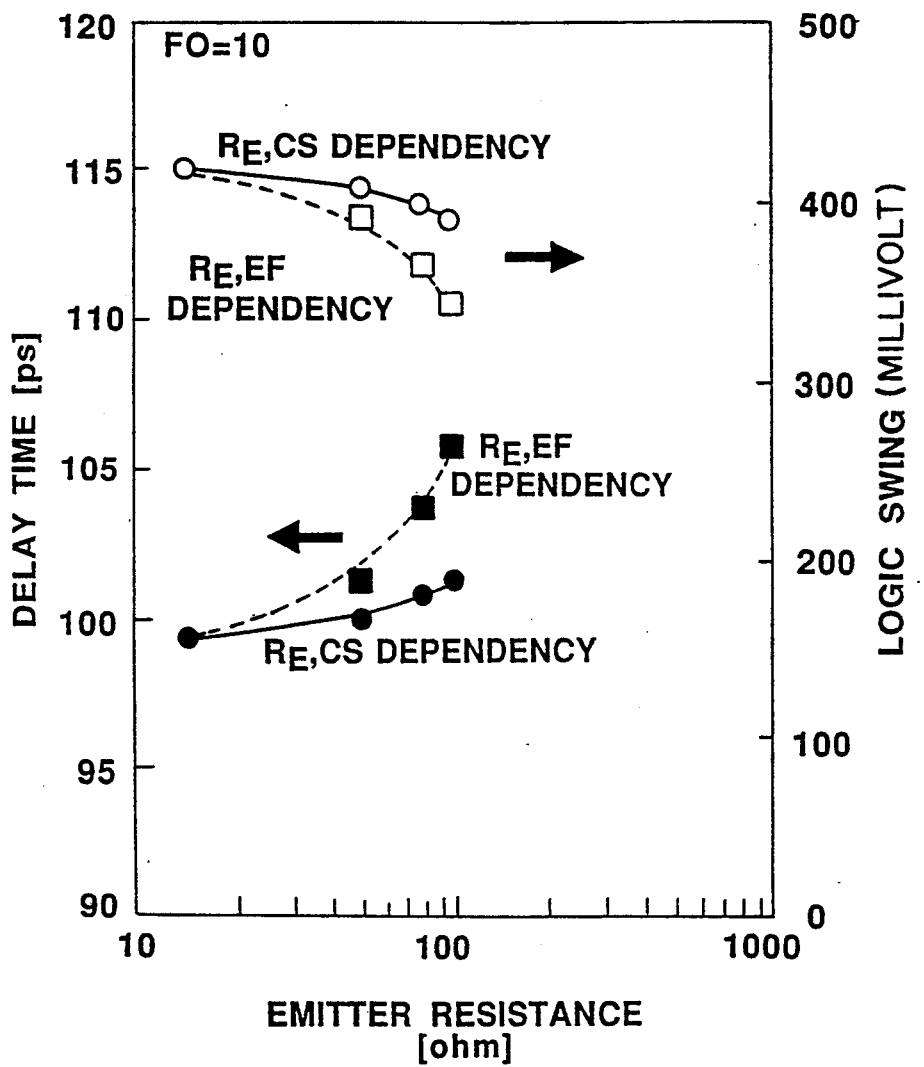
FIG. 7 is a graph illustrating the results of the measurement regarding the relation of the delay time $t_{pd}$ and the logic swing of current switch transistors and emitter follower transistor with respect to the emitter resistance $R_E$.

FIG. 7 illustrates the result of the measurement regarding the relation of the delay time $t_{pd}$ and the logic swing of the current switch transistors and the emitter follower transistor with respect to the emitter resistance. From this result it is understood that the emitter resistance of emitter follower transistor affects the delay time $t_{pd}$ and the logic swing more significantly. Therefore, it is desirable to reduce the emitter resistance of emitter follower transistor. Accordingly, by making the emitter area of an emitter follower transistor large and the emitter resistance low, the delay time $t_{pd}$ becomes short and the logic swing is kept to be large.

Figure 8:
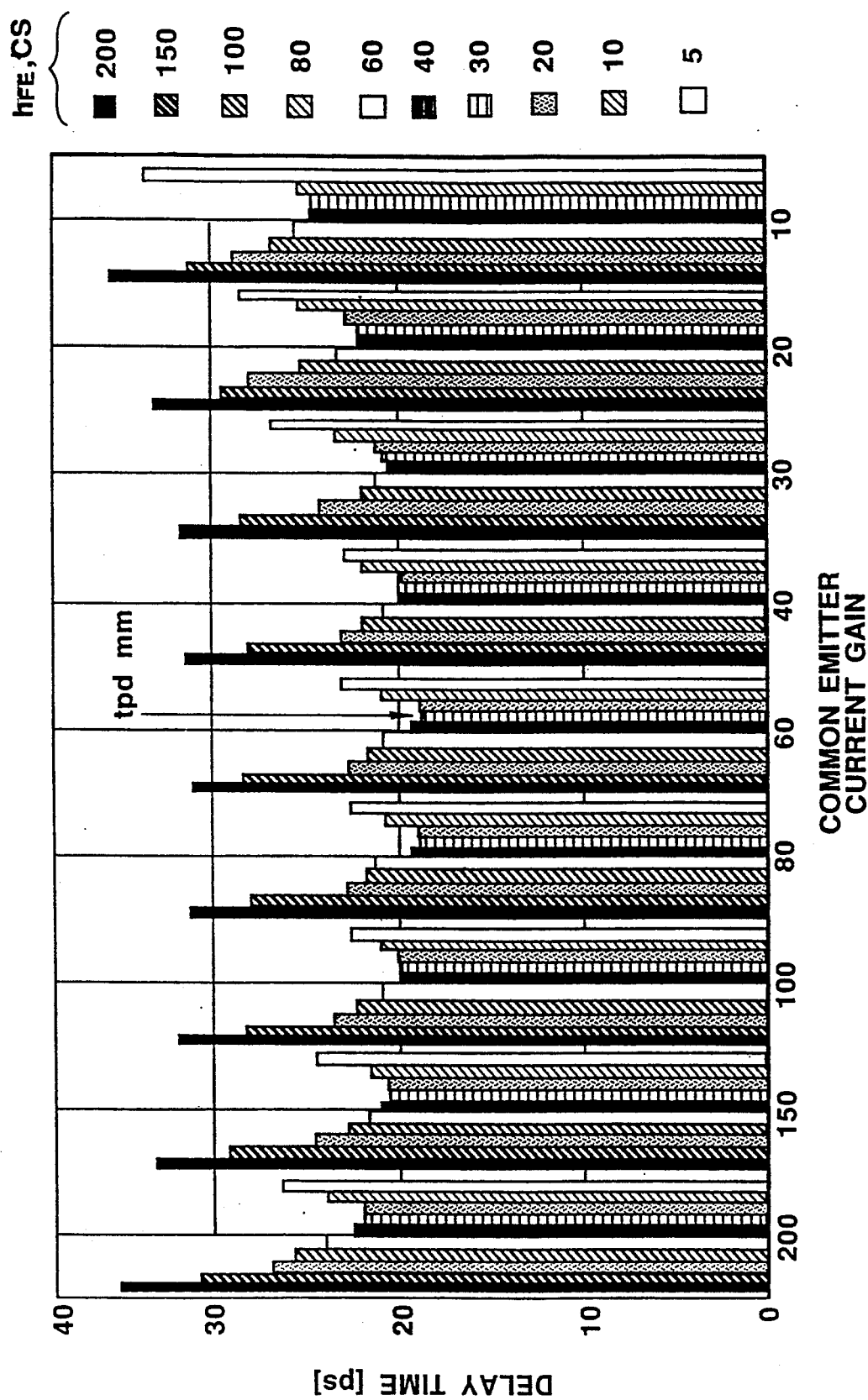
FIG. 8 is a graph illustrating the results of the measurement regarding the relation of the delay time $t_{pd}$ of current switch transistors and emitter follower transistor with respect to the common emitter current gain $h_{FE}$.

FIG. 8 illustrates the result of the measurement regarding the relation between the delay time $t_{pd}$ and the common emitter current gain $h_{FE}$ of the current switch transistors and the emitter follower transistor. From this result, it is apparent that by maintaining the common emitter current gain $h_{FE}$ of the emitter follower transistor at around 100, the delay time $t_{pd}$ becomes short, and by maintaining the common emitter current gain $h_{FE}$ of the current switch transistors at around 30, the delay time $t_{pd}$ becomes short. Preferably, by maintaining the common emitter current gain $h_{FE}$ of the emitter follower transistor at around 100 and by maintaining the common emitter current gain $h_{FE}$ of the current switch transistors at around 30, the delay time $t_{pd}$ becomes the shortest.

An embodiment of the ECL circuit of the present invention will be described in detail hereinafter with reference to the accompanying drawings.

Figure 6:
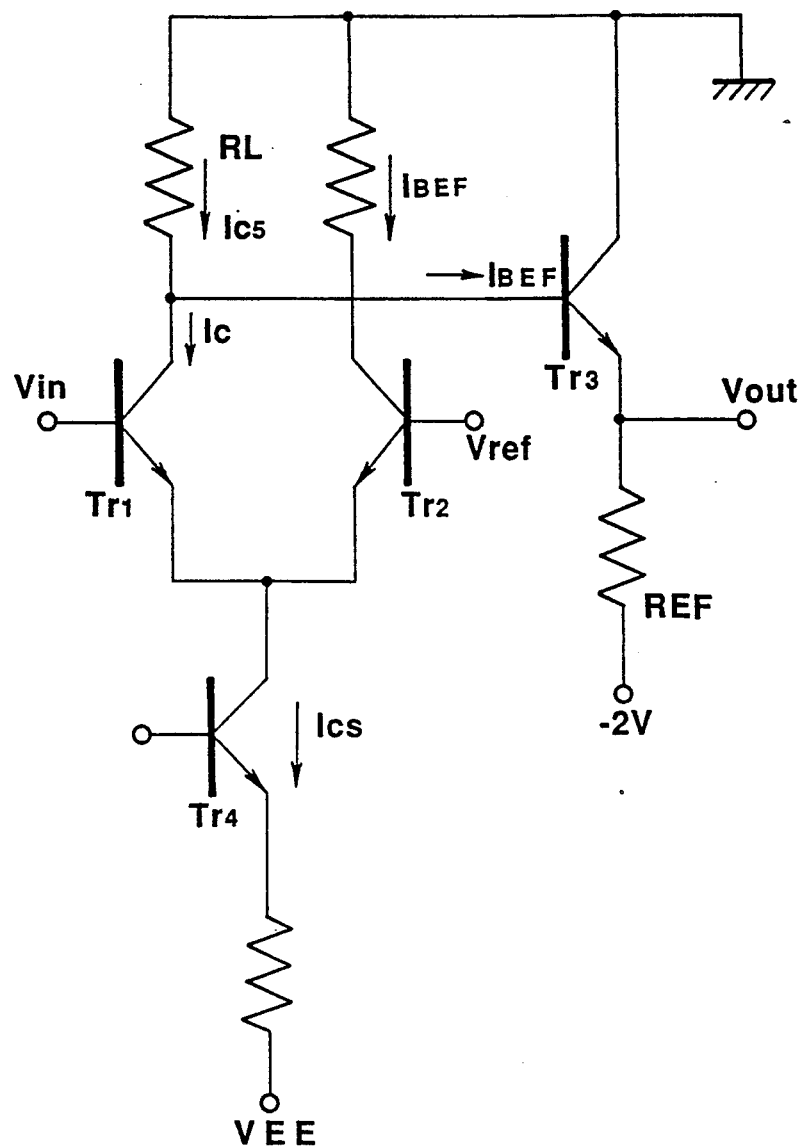
FIG. 6 illustrates an equivalent circuit of an ECL circuit.

The ECL circuit forms the basic gate of a normal ECL circuit. As shown in the circuit in FIG. 6, each collector terminal is connected to ground potential via load resistor RL, and the ECL circuit comprises a pair of a first and a second bipolar transistor Tr1 and Tr2 which constitute the current switch stage, and a third transistor Tr3 in the emitter follower stage the base potential of which is connected to the collector terminal of the first bipolar transistor Tr1, and a fourth transistor Tr4 with the collector terminals of Tr4 connected to the emitter terminals of the first and second bipolar transistors Tr1 and Tr2 of the current switch stage and with the emitter terminal of Tr4 connected to $V_{EE}$ via a resistor RE, wherein the base density is set so that $h_{FE}$ of the first and second bipolar transistors Tr1 and Tr2 becomes 30 and $h_{FE}$ of the third transistor Tr3 becomes 100. Further, the first and second bipolar transistors have an emitter area of $0.25 \times 2.5$ $\mu m^2$ and base width $W_B = 50$ nm.

The delay time in this case is 18 ps which is extremely short. This is a significant increase of the high-speed compared with the delay time of 23 ps of a conventional ECL gate in which $h_{FE}$ of the first and second bipolar transistors Tr1 and Tr2 is, the same as $h_{FE}$ of the third transistor Tr3, set to be 100.

Furthermore, by reducing the emitter area of the first and second bipolar transistor Tr1 and Tr2 to $0.25 \times 1$ $\mu m^2$, it is possible to further reduce the delay time by approximately 4 ps.

This is due to the fact that the delay in the current switch stage is dominated by the base resistance, whereas the delay in the emitter follower stage is dominated by the emitter/base junction capacitance.

It is preferably that the extent of reducing the emitter area of the first and second bipolar transistors Tr1 and Tr2 is two times smaller than the emitter follower transistor Tr3.

As described above, according to the first aspect of the present invention, it is possible to realize an increase of the operating speed by setting the direct current amplification factor of the current switch transistors to be smaller than 100.

In addition, according to the second aspect of the present invention, it is possible to realize an increase of the operating speed by setting the emitter area of the emitter follower transistor to be larger than the emitter area of the current switch transistor.

What is claimed is:

1. An emitter-coupled logic circuit device provided in an integrated circuit semiconductor device comprising:

a current switch including at least two bipolar transistors; and an emitter follower including a bipolar transistor, wherein a common emitter current gain of the bipolar transistors which constitute the current switch and a common emitter current gain of the bipolar transistor which constitutes the emitter follower are determined independently in such manner as to minimize delay time of the emitter-coupled logic circuit device.

2. The emitter-coupled logic circuit device of claim 1, wherein the common emitter current gain of the bipolar transistor which constitutes the emitter follower is around 100.

3. The emitter-coupled logic circuit device of claim 1, wherein the common emitter current gain of the bipolar transistors which constitute the current switch is around 30.

4. The emitter-coupled logic circuit device of claim 1, wherein the common emitter current gain of the bipolar transistor which constitutes the emitter follower is around 100 and the common emitter current gain of the bipolar transistors which constitute the current switch is around 30.

5. An emitter-coupled logic circuit device provided in an integrated circuit semiconductor device comprising:

a current switch including at least two bipolar transistors; and an emitter follower including a bipolar transistor, wherein a common emitter current gain of the bipolar transistors which constitute the current switch is smaller than a common emitter current gain of the bipolar transistor which constitutes the emitter follower.

* * * * *